United States Patent [19]
Berto et al.

[11] Patent Number: 6,055,725
[45] Date of Patent: May 2, 2000

[54] METHOD FOR REDUCING SHORTS ON A PRINTED CIRCUIT BOARD EDGE CONNECTOR

[75] Inventors: Daniel James Berto, Raleigh, N.C.; Jimmy Melvin Coe, Cedar Park, Tex.; Lloyd Archibald Barrington Lawrence, Jr., Pflugerville, Tex.; Todd Allen Lee, Austin, Tex.

[73] Assignee: International Business Machines Corporation, Armonk, N.Y.

[21] Appl. No.: 09/128,453

[22] Filed: Aug. 3, 1998

[51] Int. Cl.⁷ .................................................... H01R 43/02
[52] U.S. Cl. ................................ 29/879; 29/874; 29/876; 29/884
[58] Field of Search ............................. 29/884, 876, 842, 29/879, 874

[56] References Cited

U.S. PATENT DOCUMENTS 5,509,197   4/1996   Stone ...................................... 29/876 X

OTHER PUBLICATIONS

IBM Technical Disclosure Bulletin vol. 30 No. 8 Jan. 1988, pp. 217–218.

*Primary Examiner*—Carl J. Arbes
*Attorney, Agent, or Firm*—Jeffrey S. LaBaw; David H. Judson

[57] ABSTRACT

An edge connector for a circuit board having a top layer and at least one layer underlying the top layer to form a composite structure. The edge connector comprises a first set of metallic tabs formed on the top layer in a row spaced from an edge of the top layer, with each of the first set of metallic tabs having a plating spoke associated therewith formed in the one layer underlying the top layer. A second set of metallic tabs is formed on the top layer in a row adjacent the edge. A metallic tab of the first set is positioned between a pair of metallic tabs in the second set, however, the surface area of the top layer between each pair of metallic tabs in the second set is substantially free of a plating spoke.

5 Claims, 3 Drawing Sheets

METHOD FOR REDUCING SHORTS ON A PRINTED CIRCUIT BOARD EDGE CONNECTOR

BACKGROUND OF THE INVENTION

1. Technical Field

The present invention generally relates to techniques for improving the alignment between electrical contacts on a printed circuit board and an associated socket connector to thereby reduce shorts when the board is plugged into the socket.

2. Description of the Related Art

A typical computer is highly modular. During a computer's useful life, one or more components are replaced either due to maintenance or system upgrades. To this end, most computer components are now designed to be "field replaceable" and are supported on a "pluggable" printed circuit board. The board typically includes a so-called "edge connector" having metallic "tabs" that mate with spring contacts located within a connector socket, which in turn is supported on a motherboard. Each tab should mate with a specific spring contact when the printed circuit board is inserted into the connector socket. Because of the dense spacing between tabs, however, when the board is inserted into the connector, it is quite common for a tab to "short circuit" by mating with the wrong connector contact. This causes an undesirable electrical connection.

In the past, this problem has been addressed through the use of so-called "card guides" that reduce the amount of play between the pluggable card and the connector socket. While the use of a card guide helps to position the board at a precise position in the connector, this approach does not always prevent shorts. Moreover, in many applications it is not practical to build a card guide that can maintain the tight tolerances required to properly mate the edge connector and socket.

SUMMARY OF THE INVENTION

It is a primary object of this invention to reduce the possibility of short circuits when an electrical connection is made between a pluggable component card and a connector socket.

It is another primary object of the invention to improve the alignment between a pluggable component card and an electrical connector socket.

It is a further important object of this invention to improve the registration between metallic tabs of a printed circuit board (PCB) card edge and spring contacts of a connector socket.

It is another important object to decrease the effective "density" of metallic tabs on an PCB card edge to thereby reduce the likelihood of "short" when the card is plugged into an electrical socket connector.

A more specific object of the invention is to provide a method for reducing shorts on printed circuit board edge connectors while at the same time allowing more flexibility in the mating of the connector and the connector socket. Even if the board is not inserted precisely in alignment with the connector socket, shorts are less likely to occur because the "effective" distance between at least some of the metallic tabs is increased.

Yet another more general object is to improve the mechanical and electrical performance of pluggable component cards in a computer.

These and other objects of the invention are provided in an edge connector for a printed circuit board preferably having a top layer, one or more intermediate layers, and a bottom layer. A first set of metallic tabs are formed on the top layer in a row spaced from an edge of the top layer, and each of the first set of metallic tabs has a plating spoke associated therewith formed in the intermediate layer. A second set of metallic tabs are formed on the top layer in a row adjacent the edge, and each metallic tab of the first set is preferably positioned between a pair of metallic tabs in the second set when the first and second sets are viewed in plan. Preferably, the surface area of the top layer between each pair of metallic tabs in the second set is substantially free of a plating spoke because the plating spokes are "buried" in the intermediate layer. Each metallic tab in the first set is connected to its associated plating spoke by a via or other connecting means.

The foregoing has outlined some of the more pertinent objects and features of the present invention. These objects should be construed to be merely illustrative of some of the more prominent features and applications of the invention. Many other beneficial results can be attained by applying the disclosed invention in a different manner or modifying the invention as will be described. Accordingly, other objects and a fuller understanding of the invention may be had by referring to the following.

BRIEF DESCRIPTION OF THE DRAWINGS

The novel features believed characteristic of the invention are set forth In the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

The present invention is implemented in any apparatus in which a printed circuit board having electrical contacts is plugged into a connector socket. By way of example only, one such apparatus is a computer, for example, an IBM RS/6000 computer (a reduced instruction set of so-called RISC-based workstation) running the AIX (Advanced Interactive Executive Version 4.1 and above), or an Intel-based processor system running the Windows NT or OS/2® operating system. Other applications of the present invention include printed circuit boards or other "cards" used in communications equipment, audio equipment and games, among other types of electrical devices. Indeed, any application that requires a connector with many electrical signals in a small connection area may take advantage of the present invention. For illustrative purposes, however, the remainder of the Detailed Description relates to a pluggable component card for use in a computer.

Figures 1, 6:
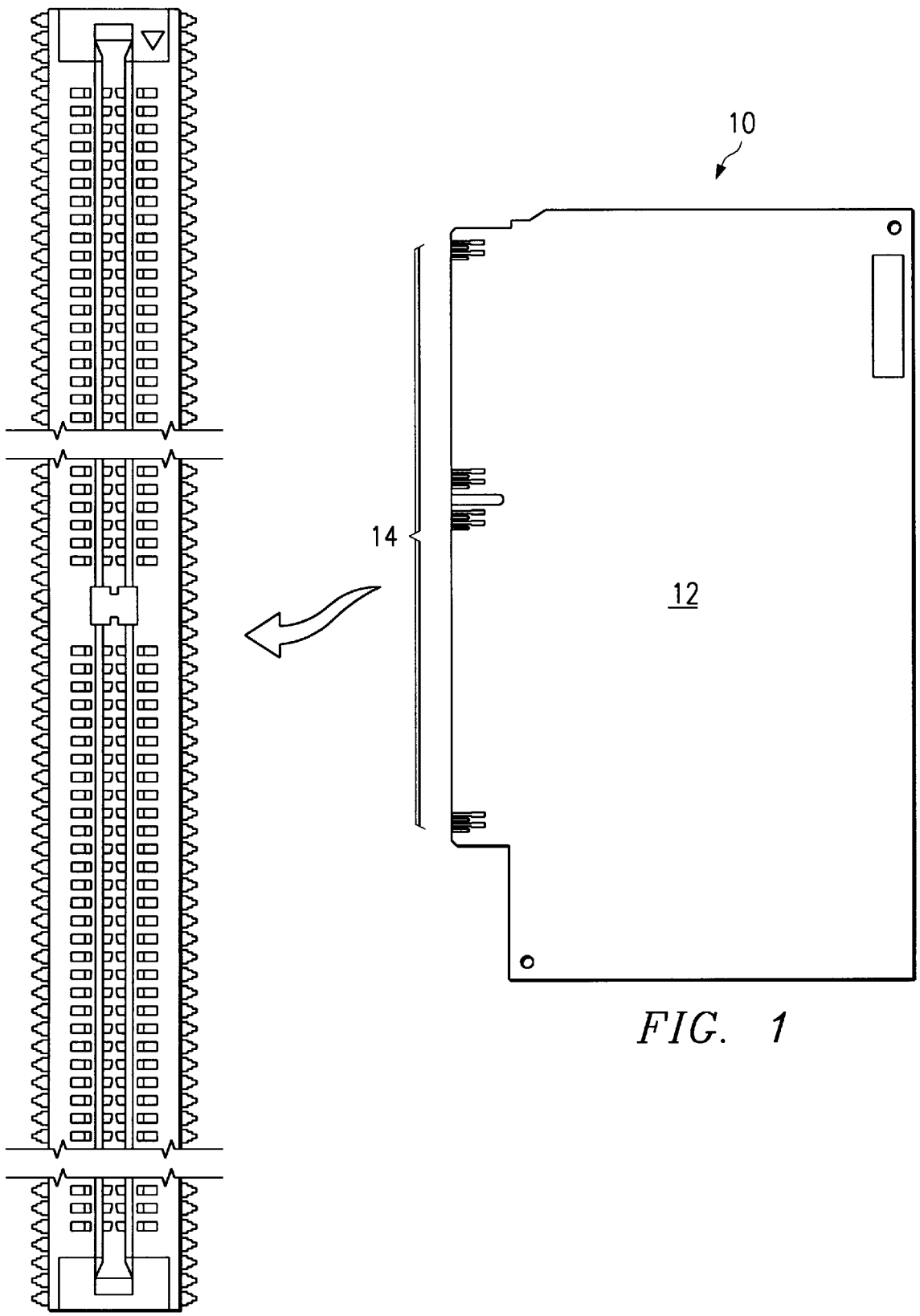
FIG. 1 is a simplified diagram of a printed circuit board card having an edge connector.
FIG. 6 is a perspective view of a connector socket for receiving the edge connector of the present invention.

One such card 10 is illustrated in FIG. 1. It includes a main body portion 12, which is typically made of an insulating material, having a plurality of electrical components (not shown) supported therein. A plurality of electrical conductors are usually etched on the insulating material and, in conjunction with the electrical components, form a so-called "printed circuit board" or PCB. The card 10 is typically "double-sided" and includes an edge connector 14 on each side including a plurality of metallic tabs. Card 10 may be single-sided as well. As is well-known in the art, the edge connector is designed to mate with an associated connector "socket" supported on, for example, a motherboard. A representative socket is shown in FIG. 6. Thus, for example, the connector socket is one manufactured by Amp, Incorporated of Harrisburg, Pa. under the Part No. 145064-2, and this socket includes a plurality of spring contacts, each of which is designed to contact a particular metallic tab thereby to establish an electrical connection between the PCB edge connector and the socket. The edge connector and the socket include two (2) distinct sections, but this is not a requirement of the invention.

Figure 2:
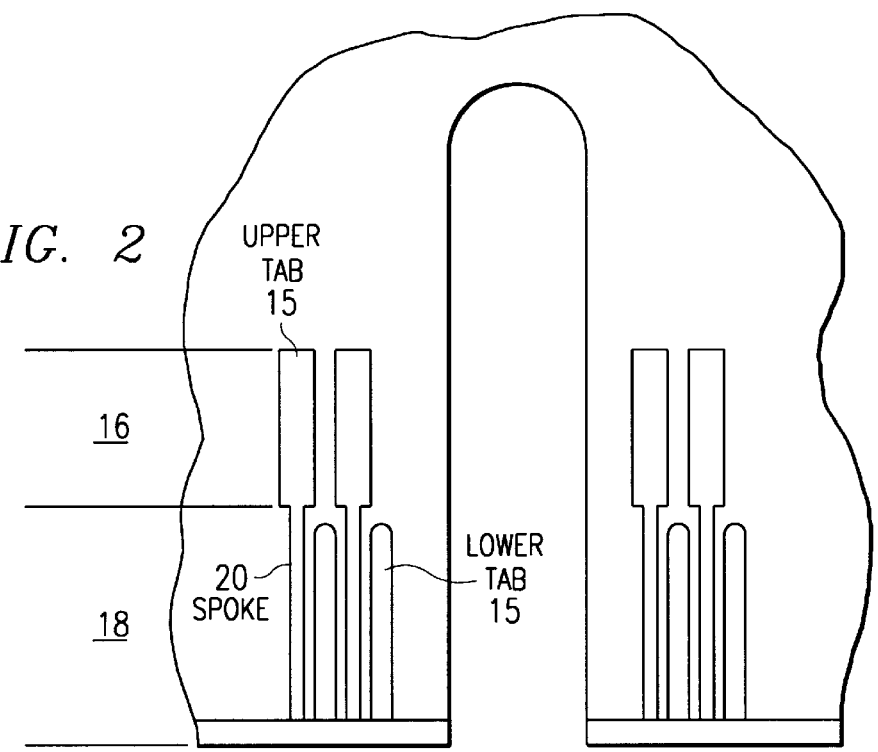
FIG. 2 is an enlarged view of the edge connector of the PCB card of FIG. 1 illustrating a conventional spoke arrangement.

FIG. 2 shows a conventional layout of the metallic tabs of the edge connector 14 of the PCB according to a known prior art approach. Typically, the metallic tabs 15 are laid out in two rows, an upper row 16 and a lower row 18. Although not meant to be limiting, the upper row of tabs 15 is normally used for address and data signals while the lower row of tabs is normally used for power and ground connections. As can be seen in this view, each upper tab includes an associated extension or "spoke" 20 on the PCB surface that extends between a pair of tabs in the lower row. The spoke of each tab in the upper row is thus effectively "interleaved" between a pair of tabs on the lower row. The spoke is used during the manufacture process to "plate" the upper tab with an appropriate plating material, such as gold. Plating the metallic tab is advantageous for several reasons including reduction of corrosion and enhancing the electrical connection between the tab and the associated spring contact. However, after the plating process, the spoke is "vestigial" in that it serves no useful function. On the contrary, the spokes actually increase the effective "density" of the lower row 18, thereby increasing the likelihood of electrical shorts when the edge connector is placed in the socket.

Figure 3:
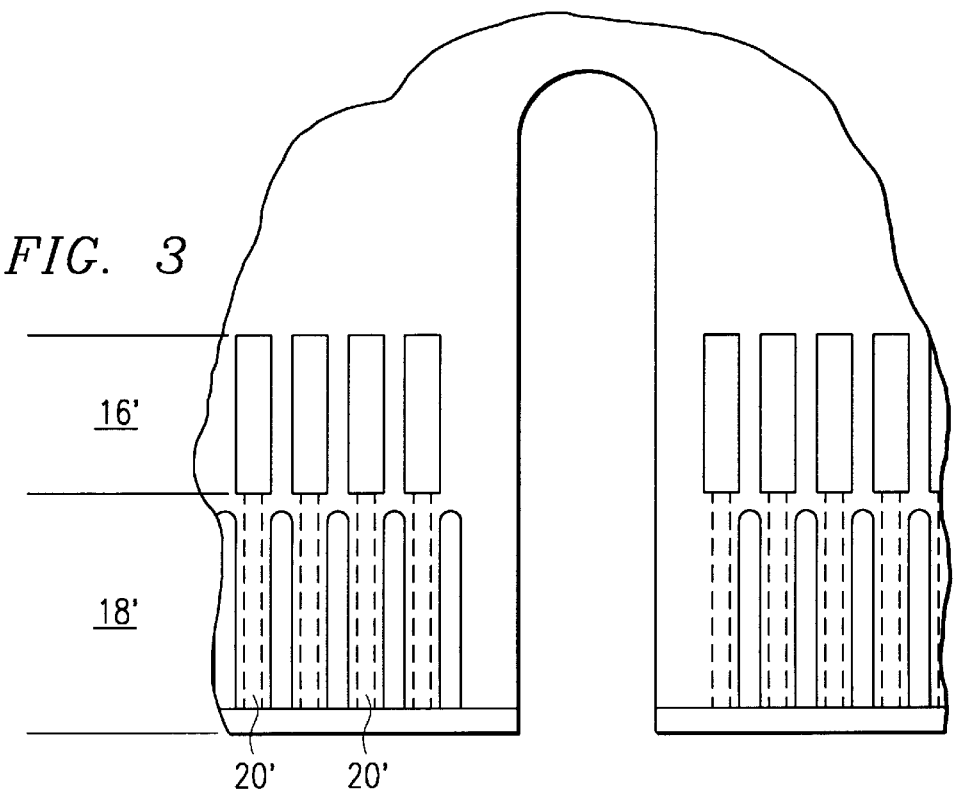
FIG. 3 is an enlarged view of an edge connector of a PCB card illustrating the "buried" spoke arrangement of the present invention.

The present invention ameliorates this problem by "burying" the spokes under the top PCB layer, namely, the layer upon which the metallic tabs are etched. This has the effect of increasing the distance between each pair of tabs in the lower row without actual changing the placement of those tabs because the "interleaved" spoke is no longer present on the same layer. This contruction is shown in FIG. 3. In this view, the metallic tabs 15 are again laid out in two rows, an upper row 16' and a lower row 18'. However, as compared to FIG. 2, each spoke 20' is now buried under the top PCB layer and thus is illustrated in phantom. Thus, each upper tab now includes a spoke 20' underlying the PCB surface layer and that extends between a pair of tabs in the lower row. The spoke of each tab in the upper row is still "interleaved" between a pair of tabs on the lower row, however, the spoke is not present on the upper layer itself. This has the effect of decreasing the "density" of the tabs in the lower row or "widening" the distance between each pair of tabs. This construction reduces short circuits that otherwise occur when the spokes are present on the top layer.

The present invention provides numerous advantages over the prior art. By using the "buried" spoke, the density of the metallic tabs on the lower row of the connector is significantly decreased as noted above. This allows much more flexibility in the mating of the connector and the socket. Even if the pluggable component board is not inserted precisely correct, shorts are not likely to occur because the distance between the metal tabs on the lower row is greater than in the prior art. Burying the spoke "internally" effectively increases the distance between the metallic tabs on the lower row. This substantially reduces the likelihood of shorts between the tabs and the spring contacts of the connector socket.

Figure 4:
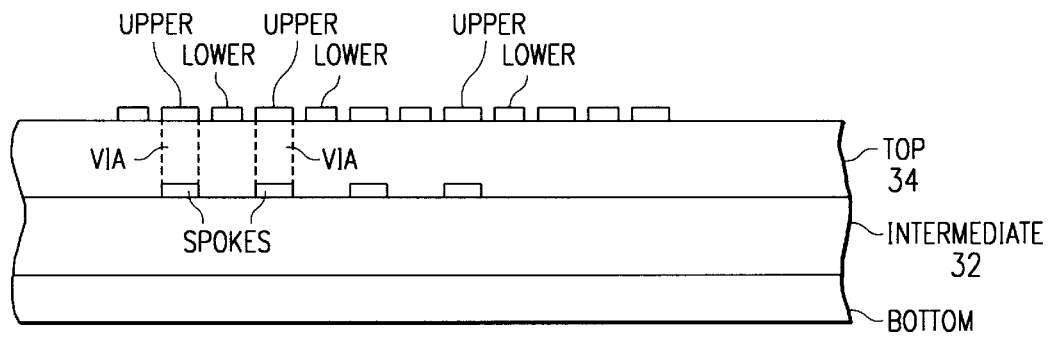
FIG. 4 is an elevation of the edge connector showing the various layers that are laminated together to form a composite structure.

Thus, according to the invention, the edge connector comprises a first set of metallic tabs formed on the PCB top layer in a row (namely, the upper row) spaced from the card edge. Each of the first set of metallic tabs has a plating spoke associated therewith formed in an underlying (e.g., intermediate or perhaps even a lower) layer. The phrase "underlying layer" should thus be broadly construed to cover any layer below the layer on which the tabs are etched. A second set of metallic tabs are formed on the top layer in a row (namely, the lower row) preferably adjacent the card edge, and each metallic tab of the first set is preferably positioned between a pair of metallic tabs in the second set when the first and second sets are viewed from the top or "plan" view. Preferably, the surface area of the top layer between each pair of metallic tabs in the second set is free or substantially free of a plating spoke because the actual plating spokes are "buried" in the intermediate layer. Each metallic tab in the first set is connected to its associated plating spoke by a via or other known connection means such as a conductor as illustrated in FIG. 4.

In the preferred embodiment, the edge connector is a composite structure formed of a plurality of layers of insulating material laminated together in a known manner. In one illustrative embodiment shown in elevation in FIG. 4, which is a single-sided card, the composite structure comprises a bottom layer 30, intermediate layer 32, and upper or "top" layer 34. Multiple intermediate layers may be used. The first and second sets of metallic tabs are etched on the top layer 34 and the plating spokes are etched in the intermediate layer 32. The edges of the plating spokes are visible in this view. The means for connecting the spoke to the tab is preferably a via, although this connecting means may alternatively be any conductive element such as a wire. Preferably, the composite structure is manufactured by forming the first and second sets of metallic tabs on the first layer, forming the spokes on the intermediate layer, and then laminating the first and second layers.

Figure 5A:
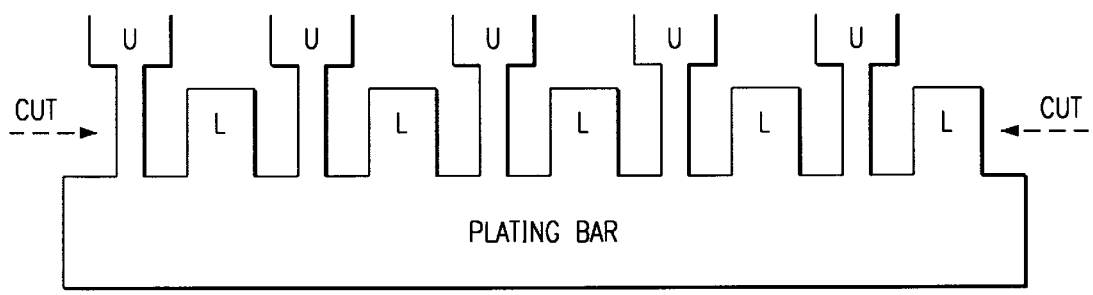
FIG. 5A is a schematic representation of a known construction wherein the first and second sets of metallic tabs are attached to a plating bar.
Figure 5B:
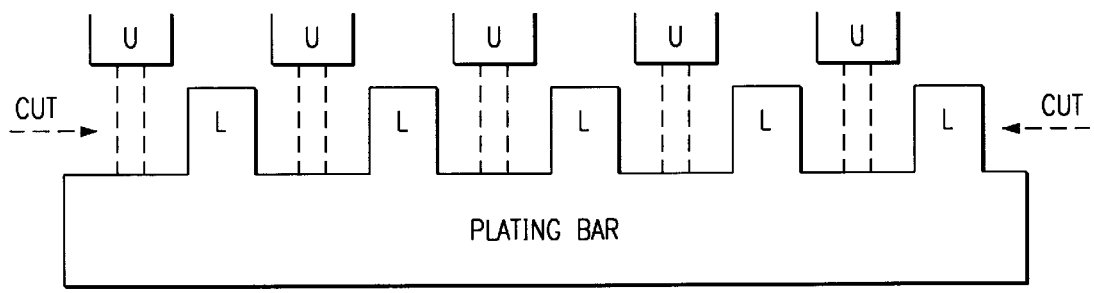
FIG. 5B is a schematic representation of the inventive construction wherein the spokes of the first set of metallic tabs are buried under the top layer of the card.

During this manufacturing process, the metallic tabs are plated by applying a plating current to a plating bar. FIG. 5A shows the prior art approach wherein the spokes are interleaved between pairs of metallic tabs in the lower row and etched on the top layer. After the sets of tabs are plated, a transverse cut is made to form the edge connector. In FIG. 5B, the spokes are buried and are thus represented in phantom. After the plating process, the transverse cut is made to form the edge connector. A side view of the connector (following the transverse cut) is illustrated in FIG. 4, as previously described.

Although the present invention is preferably implemented in an edge connector of the type illustrated in the drawings, the use of "buried" spokes to facilitate decreasing the effective density of metallic edge contacts in an electrical connector has broader applicability. Thus, the teachings of the present invention should not be construed to be limited to the particular two-tiered metallic tab configuration illustrated in FIG. 3. Morover, while the embodiment shown in FIG. 4 illustrates a single-sided card, the inventive concept of burying spokes is also useful in a double-sided carad wherein each edge connector (one per side) includes the buried spokes. The double-sided configuration is preferably for ease of manufacture.

Although the invention has been particularly shown and described with reference to a preferred embodiment, it will be understood by those skilled in the art that various changes in form and detail may be made therein without departing from the spirit and scope of the invention.

What is claimed is:

1. A method of making an edge connector for a printed circuit board, comprising the steps of:

forming a plurality of interconnects on a substrate;

forming an insulative first layer on the substrate and the plurality of interconnects;

on the first layer, forming a first set of metallic pads in a row spaced from an edge of the substrate, each of the first set of metallic pads being positioned above one of the plurality of interconnects;

on the first layer, forming a second set of metallic pads in a row adjacent the edge of the substrate, wherein each metallic pad of the second set is positioned between a pair of the plurality of interconnects;

forming a plating bar formed on the first layer adjacent to the edge of the substrate in conductive contact with the second set of metallic pads;

forming a first plurality of vias extending through the first layer and electrically connecting each of the plurality of interconnects to the plating bar; and forming a second plurality of via extending through the first layer and electrically connecting each of the first set of metallic pads to one of the plurality of interconnects.

2. The method as described in claim 1 wherein the substrate includes a plurality of layers, each layer including a plurality of printed interconnections.

3. The method as described in claim 1 further including the step of plating the metallic pads of the first set.

4. The method as described in claim 1 further including the step of plating the metallic pads of the second set.

5. The method as described in claim 1 wherein the first and second sets of metallic tabs are plated in gold.

* * * * *